Jan. 5, 1960 H. N. FRIHART 2,920,197

WAVE SIGNAL TUNER WITH REMOVABLE SWITCH WAFERS

Filed Aug. 22, 1956 2 Sheets-Sheet 1

INVENTOR.
Henry Neil Frihart,
BY Mueller & Aichele
Atty's.

WAVE SIGNAL TUNER WITH REMOVABLE SWITCH WAFERS

Filed Aug. 22, 1956

INVENTOR.
Henry Neil Frihart,
BY
Mueller & Aichele
Att'ys.

2,920,197

WAVE SIGNAL TUNER WITH REMOVABLE SWITCH WAFERS

Henry Neil Frihart, La Grange Park, Ill., assignor to Motorola, Inc., Chicago, Ill., a corporation of Illinois Application August 22, 1956, Serial No. 605,616

3 Claims. (Cl. 250—40)

This invention relates to wave signal tuners and more particularly to multi wafer tuners of the type used in television receivers.

One form of television tuner in present use for selecting VHF signals on channels 2–13 comprises a detenting type 12 position switch together with suitable radio frequency amplifier and mixer-oscillator stages. This apparatus is generally assembled in a shielded housing with various terminals thereof coupled to further sections of the receiver. The complete unit may consist of a main chassis and three or four wafers each having thereon tuned circuit elements for each of the channels and corresponding contacts of a 12 position switch. The apparatus may be assembled in compact form to conserve space and to provide short connections among the components. Thus, it may be seen that actual assembly and wiring of the various components may be a difficult and time consuming task due to the limited working space and the necessary careful soldering of the many electrical connections of the rather small components used in such a tuner. Furthermore, once assembled, later servicing of the device in order to replace a part or clean the switch contacts may be quite inconvenient and involve unsoldering many connections for access to a given portion of the unit.

Accordingly, it is an object of this invention to provide a tuner which may be easily assembled in a minimum of time and at reduced expense.

Another object is to provide a channel selecting tuner for a television receiver having component parts which are readily accessible for pre-assembling electrical components thereon and which may be fitted together by expedient mechanical plug-in operations.

Another object of the invention is to provide a tuner which may be disassembled through simple mechanical operations for convenient access to components thereof for the purpose of servicing the device.

A feature of the invention is the provision of a tuner having a frame for supporting electrical components and a channel selecting switch which plugs into circuit connectors on the frame so that the components can be easily assembled on the frame and the switch can be added by merely mechanically fitting it to the connectors after preassembly thereof.

Another feature is the provision of a multi-gang channel selector for a television tuner having separate wafers for each gang which are mechanically and electrically coupled to a chassis by plug type construction, and with the wafers including switch sections operated by a removable shaft so that initial wiring and later servicing of the unit are all greatly simplified.

Another feature is the provision of separate gangs for a channel selecting switch removably supported on one portion of a three-sided frame and further secured in place by guide slots of a strut extending between the ends of the frame to form an open type structure from which the switch gang can be removed for convenient access to electrical components disposed within the frame.

Further objects, features and the attending advantages thereof will be apparent upon consideration of the following description and accompanying drawings in which.

The invention provides a tuner for selecting television channels in which radio frequency components, such as those utilized in radio frequency amplifier and mixer-oscillator, are mounted on a chassis which forms the intermediate portion of a three-sided frame. One end of the frame is detachable to simplify wiring of the components on the frame. Wafers, or gangs, of a multi-position switch which carry various tuned circuit elements are removably supported by the chassis by means of a plug and receptacle construction which furnishes electrical coupling to the radio frequency components and mechanical support for the wafers. A removable strut extending between the end portions of the frame includes slots for further retaining corners of the wafers and a shaft extending between the end portions of the frame and through the wafers is rotatable to operate switches carried on these wafers. This plug-in type construction expedites assembly since the chassis and wafers can be wired before assembly of the complete tuner and servicing is facilitated since portions of the tuner are more accessible.

Figures 1, 2, 3, 4:
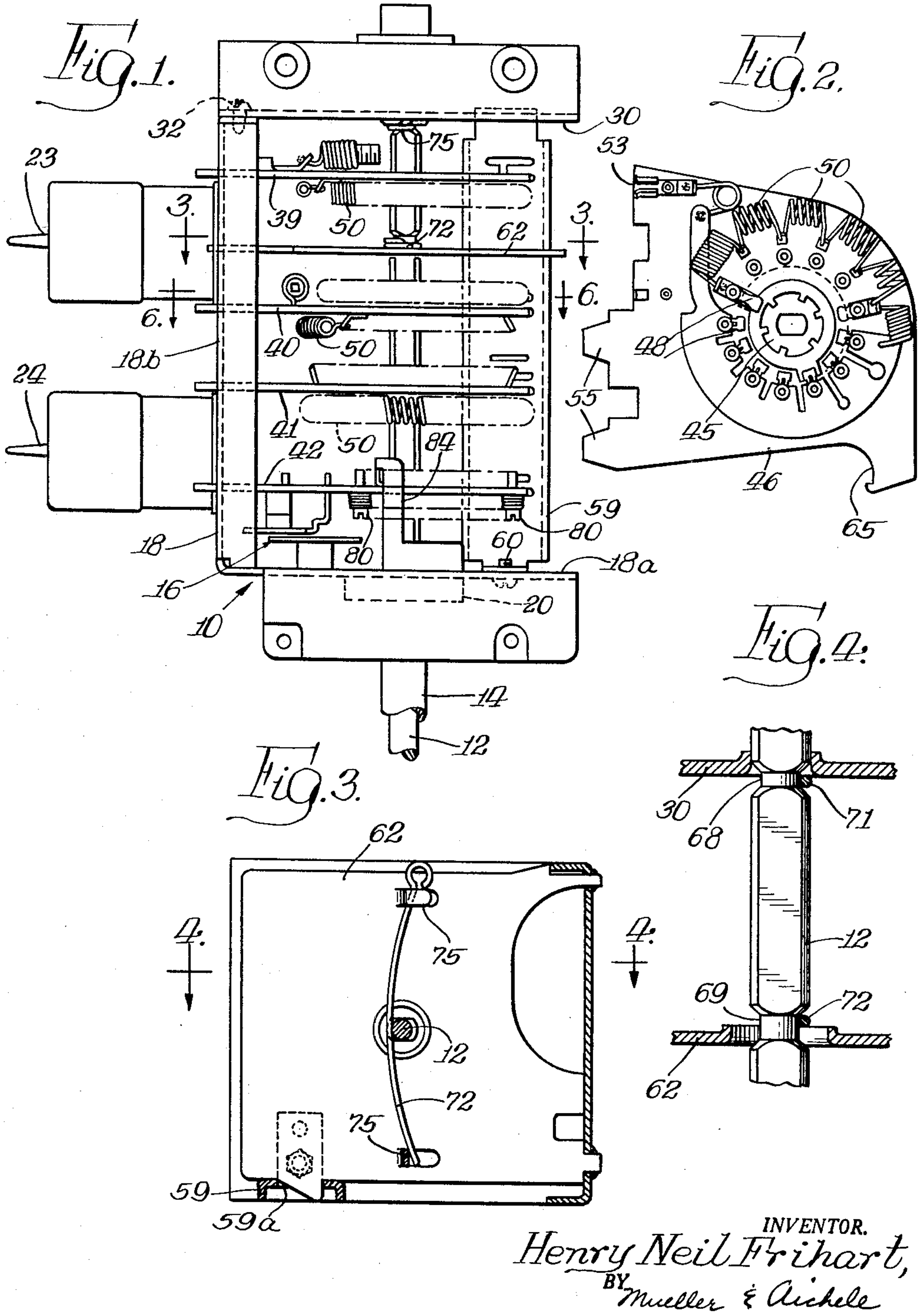
Fig. 1 is a plan view of an assembled television tuner constructed in accordance with the invention.
Fig. 2 is an elevational view of a switch wafer from the tuner of Fig. 1.
Fig. 3 is a sectional view along the line 3—3 of Fig. 1.
Fig. 4 is a sectional view along the line 4—4 of Fig. 3.

Fig. 1 is a view of the assembled tuner 10 which is adapted to be installed in a television receiver for selecting VHF channels 2–13 by rotating shaft 12 to which is affixed a suitable knob (not shown). A sleeve 14 is rotatable about shaft 12 and may be manipulated for controlling the fine tuning condenser 16 through a suitable mechanical drive also not shown.

Figure 5:
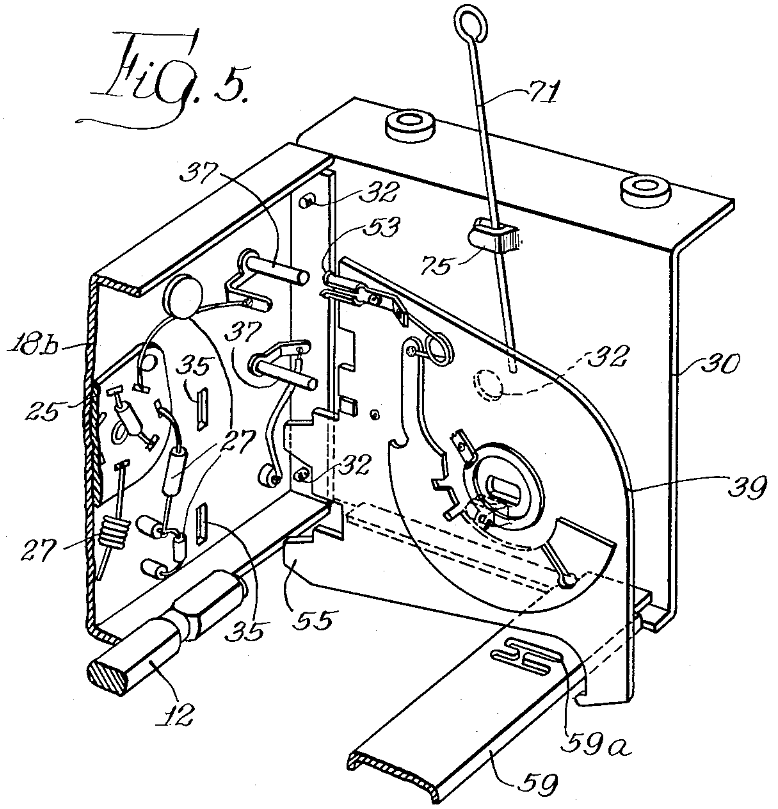
Fig. 5 is an exploded perspective view of a portion of the tuner.

One piece, L-shaped frame 18 includes a front portion 18*a* and a side portion 18*b*. The front portion 18*a* carries a bearing and detenting mechanism 20 for 13 fixed positions of shaft 12. The side portion 18*b* forms the main chassis of the tuner and supports vacuum tubes 23 and 24 which are incorporated, respectively with the radio frequency amplifier stage and the mixer oscillator stage of the tuner. Various other electrical components for the stages are also supported by the chassis, such as socket 25 and components 27 (Fig. 5). A back portion 30 is secured to the side portion 18*b* by means of screws 32 and this contains a bearing aperture 32 for shaft 12. The complete tuner 10 is installed in a television receiver through suitable fastenings engaging a flange on front portion 18*a* and a flange on back portion 30. The device is further shielded by means of a metallic hood (not shown) so as to prevent intercoupling among other sections of the receiver. Side portion 18*b* also carries terminals for coupling the complete tuner to the remainder of the television receiver.

For the most expeditious assembly of the tuner, components 27 are assembled on side portion or chassis 18*b* before back portion 30 has been secured in place so that there is a maximum available working space during this operation. Following this, back portion 30 is fastened by means of screws 32 thus forming a three-sided frame.

Side portion 18*b* also has slots therein such as slots 35 and male electrical connectors such as connectors 37 to support switch wafers or gangs 39, 40, 41 and 42. These wafers have centrally located rotors (Figs. 2 and 6), which are engageable with various associated fixed contacts such as contacts 48 of wafer 46. Tuned circuit elements 50 are connected to the fixed contacts of the wafers so that in various positions of the rotors different elements may be selected for tuning the various television channels.

Figure 6:
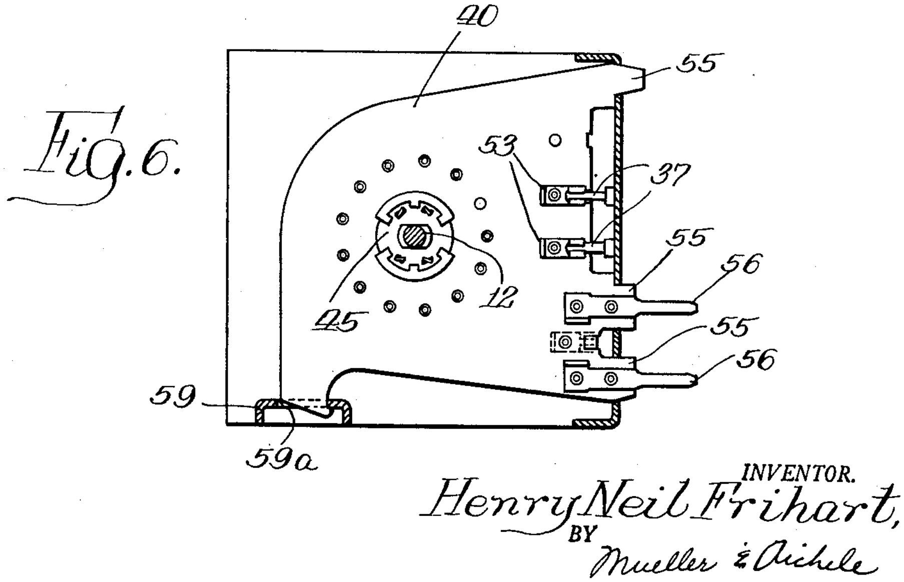
Fig. 6 is a sectional view along the line 6—6 of Fig. 1.

The wafers also include female electrical connectors 53 to engage connectors 37, and electrically connect the tuned circuit elements to the components on side portion **18*b*. The wafers further have projections 55 extending in the same direction which connectors 53 face so that these projections may be inserted in slots 35 of side portion 18*b* for fixing the wafers in place. As shown in Fig. 6 projections 55 may also support connectors 56 for coupling the tuner to other portions of the receiver. Thus it may be seen that each wafer can be wired with the various tuned circuit elements when they are unassembled and in condition for most convenient access to the switch terminals and then merely plugged into place with the electrical connections made through the connectors 37 and 53**.

Before finally assembling the wafers in the tuner, a strut 59 is fastened to front portion **18*a* by means of a bolt 60 and soldered to back portion 30 to insure good electrical connection. A shield 62 is also fastened in place by soldering to strut 59 and side portion 18*b*. This prevents undesired coupling among the portions of the tuner. The wafers may then be plugged into the slots and connectors of side portion 18*b* and further secured at the corners by means of hooked portion 65 and engageable with slots 59*a* of strut 59**.

When the wafers are in position, shaft 12 may be installed in the rotors 45 and in the bearing 20 and bearing aperture 32 of the frame. The shaft has flattened sides so that the rotors may be turned thereby. As shown in Figs. 3, 4 and 5, the shaft has annular grooves 68 and 69 positioned respectively inside of back portion 30 and on a back side of shield 62 into which spring pins 71 and 72 are fitted. These springs are supported by lugs 75 on back portion 30 and shield 62 so that the shaft 12 is biased toward side portion **18*b* which tends to maintain the wafers 38—42 in position and provide a wiping ground connection for shaft 12**.

Wafer 42 is associated with the local oscillator stage of the tuner and includes various trimmer adjustments 80 which are available to receive a screw driver through apertures in front portion **18*a* to align the local oscillator. An arm 84 is affixed to front portion 18*a* and extends around wafer 42 and into engagement with the back side thereof so that there will be no movement of this wafer during alignment of the trimming adjustment 80**. Otherwise movement thereof could cause variation of the electrical characteristics of the device making alignment difficult.

Accordingly, this invention provides an improved tuner for a television receiver the various portions of which may be readily assembled and wired while in unassembled condition. This both speeds up manufacture and results in better construction because of greater access to the parts thereof. The components are then assembled by simply plugging in various gangs of the channel selecting switch and installing a shaft for this switch. It can further be seen that the device may be readily serviced when any component needs replacing or the switch contacts require cleaning by simply removing the switch shaft and unplugging the various switch wafers.

I claim:

1. A tuner for wave signals including in combination, a frame having a unitary front and an apertured side, a back for said frame adapted to be fastened to said side, bearing means carried by said front and back, circuit means supported on said side, a plurality of wafers having rotatable switching portions with apertures to receive a shaft for operating the same, said wafers further having projecting portions adapted to fit the apertures in said side for supporting said wafers thereby, tuning circuit means supported on said wafers and coupled to said switching portions, electrical plug and receptacle means for coupling said switching portions and said tuning circuit means to said circuit means supported on said side, said wafers having hook portions opposite from said projecting portions for supporting the same, a removable strut member secured to said front and back remotely from said side, said strut member having slots therein to receive said hook portions for securing said plurality of wafers to said frame, a shaft adapted to be positioned through said apertures of said switching portions and supported in said bearing means for operating said tuner, said shaft having an annular groove adjacent said back, and spring means supported by said back and disposed in said annular groove for urging said shaft and said wafers toward said side to secure engagement of said plug and receptacle means.

2. A tuner for wave signals including in combination, a frame having an end portion and a side portion forming a chassis, a further end portion for said frame removably secured to said side portion, bearing means carried by said end portions, first circuit means supported on said chassis, a plurality of wafers having rotatable switching portions with apertures to receive a shaft for operating the same, tuning circuit means supported on said wafers and prewired to said switching portions, means for suporting said wafers in fixed relation on said side including electrical connector means for coupling said switching portions and said tuning circuit means to said first circuit means, said electrical connector means comprising the sole electrical connection of said tuning circuit means and said switching portions to said first circuit means, said wafers having projecting portions opposite said means for supporting the same, a strut member removably secured to said end portions remotely from said side portion, said strut member having openings therein to receive said projecting portions for further securing said plurality of wafers to said frame, and a shaft positioned in said apertures of said switching portions and supported in said bearing means for operating said switching portions of said tuner.

3. A tuner for wave signals including in combination, a frame having a unitary end portion and an apertured side portion, a further end portion for said frame removably secured to said side portion, bearing means carried by said end portions, circuit means supported on said side portion, a plurality of preassembled wafers having rotatable switching portions with apertures to receive a shaft for operating the same, said wafers further having first projecting portions adapted to fit the apertures in said side portion for supporting said wafers thereby, tuning circuit means supported on said wafers and prewired individually to said switching portions, electrical conductor means fixing said wafers to said side portion and coupling said switching portions and said tuning means to said circuit means supported on said side portion, said wafers having further projecting portions opposite said first projecting portions for further supporting said wafers, a single removable strut member secured to said front and back portions remotely from said side portion, said strut member having slots therein to receive said further projecting portions for supporting said plurality of wafers by said frame, and a shaft adapted to be positioned through said apertures of said switching portions and supported in said bearing means for operating said switching portions.

References Cited in the file of this patent

UNITED STATES PATENTS

| | | |
|---|---|---|
| 2,268,619 | Reid | Jan. 6, 1942 |
| 2,551,228 | Achenbach | May 1, 1951 |
| 2,577,955 | Dixon | Dec. 11, 1951 |
| 2,707,272 | Blitz | Apr. 26, 1955 |
| 2,718,623 | Yoder | Sept. 20, 1955 |
| 2,759,158 | Puerner | Aug. 14, 1956 |
| 2,778,943 | Blonder | Jan. 22, 1957 |
| 2,787,713 | Aust | Apr. 2, 1957 |